(12) United States Patent
Smith et al.

(10) Patent No.: US 7,858,962 B2
(45) Date of Patent: Dec. 28, 2010

(54) ALINGAN LIGHT-EMITTING DEVICE

(75) Inventors: Katherine Louise Smith, Oxford (GB);
Mathieu Xavier Sénès, Oxford (GB);
Tim Michael Smeeton, Oxford (GB);
Stewart Edward Hooper, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 12/354,317

(22) Filed: Jan. 15, 2009

(65) Prior Publication Data

US 2009/0179191 A1    Jul. 16, 2009

(30) Foreign Application Priority Data

Jan. 16, 2008   (GB)   ................... 0800742.9

(51) Int. Cl.
*H01L 29/06* (2006.01)
(52) U.S. Cl. .......................................... 257/13; 257/79
(58) Field of Classification Search .................. 257/13, 257/14, 79, 94
See application file for complete search history.

(56) References Cited

U.S. PATENT DOCUMENTS

| 2005/0116215 A1 | 6/2005 | Hooper et al. |
| 2006/0244002 A1 | 11/2006 | Hooper et al. |
| 2009/0179191 A1* | 7/2009 | Smith et al. ................... 257/13 |

FOREIGN PATENT DOCUMENTS

| JP | 10-215029 | 8/1998 |
| JP | 11-126949 | 5/1999 |

OTHER PUBLICATIONS

UK Search Report for corresponding application No. GB 0800742.9 dated Apr. 27, 2008.
Y K Su et al., "InGaN/GaN blue light-emitting diodes with self-assembled quantum dots", Semiconductor Science and Technoogy 19 (2004) p. 389-392.
Y. H. Luo et al., "Photoluminescence of InAs Quantum Dots Coupled to a Two-dimensional Electron Gas", Journal of Electronic Materials, vol. 30, No. 5, 2001, p. 459-462.
T. Egawa et al. "High Performance of InGaN LEDs on (111) Silicon Substrates Grown by MOCVD" IEEE Electron Device Letters, vol. 26, No. 3, Mar. 2005, p. 169-171.

* cited by examiner

*Primary Examiner*—Mark Prenty
(74) *Attorney, Agent, or Firm*—Renner, Otto, Boisselle & Sklar, LLP

(57) ABSTRACT

A semiconductor light-emitting device fabricated in the (Al,Ga,In)N materials system has an active region for light emission (3) comprising InGaN quantum dots or InGaN quantum wires. An AlGaN layer (6) is provided on a substrate side of the active region. This increases the optical output of the light-emitting device. This increased optical output is believed to result from the $Al_xGa_{1-x}N$ layer serving, in use, to promote the injection of carriers into the active region.

25 Claims, 5 Drawing Sheets

ALINGAN LIGHT-EMITTING DEVICE

This Nonprovisional application claims priority under U.S.C. §119(a) on Patent Application No. 0800742.9 filed in U.K. on Jan. 16, 2008, the entire contents of which are hereby incorporated by reference.

FIELD OF THE INVENTION

The invention relates to light emitting devices fabricated in the AlGaInN material system and, in particular, to such light-emitting devices having an active region that includes InGaN quantum dots or quantum wires.

BACKGROUND OF THE INVENTION

A semiconductor quantum dot is a volume of semiconductor material different from that of the surrounding matrix with a dimension of typically less than 50 nm in all directions. The small size results in the confinement of carriers (electrons or holes, or both electrons and holes), and therefore the presence of quantum size effects, in all three dimensions. The observation of individual quantum dots, and the behaviour due to the quantum confinement in all three dimensions (such as changes in the temperature stability of the output power and the emission wavelength of devices) allows quantum dots to be distinguished from quantum wells, where quantum confinement only occurs in one dimension.

There is currently considerable interest in fabricating quantum dot light emitting devices in the aluminum gallium indium nitride (or (Al,Ga,In)N) material system. The (Al,Ga,In)N material system includes materials having the general formula $Al_xGa_yIn_{1-x-y}N$ where $0<x<1$ and $0<y<1$. In this specification, "AlGaInN" denotes a member of the (Al,Ga,In)N system having non-zero amounts of Al, Ga and In, "InGaN" denotes a member having zero Al content and non-zero amounts of In and Ga, etc. The (Al,Ga,In)N material system can emit light in the ultra-violet, visible, and infrared parts of the electromagnetic spectrum. The use of quantum dots has several advantages over the use of quantum wells. The 3D confinement results in a weaker dependence of device characteristics with temperature as can be seen from FIG. 3a. FIG. 3a shows the output photoluminescence intensity of a light-emitting device having a conventional quantum well active region (squares) and a light-emitting device having a quantum dot active region (circles). In addition the very narrow density of states obtainable with a quantum dot active region owing to the 3D confinement results in a narrow gain spectra leading to significantly lower threshold currents for laser diodes. Obtaining a very narrow density of states requires a degree of uniformity of the quantum dots in the active region of the device.

FIG. 1 is a schematic sectional view of a typical semiconductor light emitting diode with a quantum dot active region fabricated in the AlGaInN material system. A n-type GaN buffer layer 2 is disposed on a substrate 1. An InGaN quantum dot layer 3a comprising InGaN quantum dots 3c is disposed on the buffer layer 2. Each quantum dot 3c has a limited extent in the x-, y- and z-directions. A GaN capping layer 3b is disposed on the InGaN quantum dot layer 3a. Further quantum dot layers 3a and capping layers 3b may then be grown to form a stack of InGaN quantum dot layers. An AlGaN electron-blocking layer 4 may be disposed on the final quantum dot layer 3a or the final capping layer 3b, or the AlGaN layer 4 may be omitted. A p-type GaN layer 5 may be disposed on the final quantum dot layer 3a, the final capping layer 3b or, if present, the AlGaN layer 4. With an InGaN quantum dot active region the device is able to emit light throughout the visible wavelength range and into the ultraviolet and infrared regions of the electromagnetic spectrum.

It is known to form self-assembled InGaN quantum dots as the active region of a light emitting diode. See for example Y K Su et al. Semicond. Sci. Technol. 19 (2004) 389-392. This document refers to an InGaN quantum dot LED.

A semiconductor quantum wire is a volume of semiconductor material different from that of the surrounding matrix with a dimension of typically less than 50 nm in two directions and a greater extent in the third direction. The small size in two directions results in the confinement of carriers (electrons or holes, or both electrons and holes), and therefore the presence of quantum size effects, in two dimensions.

Egawa et al disclose, in "High Performance InGaN LEDs on (111) silicon substrates grown by MOCVD", IEEE Electron Device Letters, Vol 26, No. 3, pp 169-171 (2005), a light-emitting diode structure having a 20 nm thick n-$Al_{0.27}Ga_{0.73}N$ layer disposed between the active region and the substrate. The AlGaN layer is separated from the active layer by a 20-pair AlN/GaN multilayer and a 0.2 μm thick GaN layer—that is, by a total of 700 nm.

JP-10 215 029, discloses providing an AlGaN layer 7 below an InGaN active layer such that there is a difference of at least +3% between the lattice constants of the two layers. This difference in lattice constant generates strain, and leads to three-dimensional island-shape growth such that an active layer containing islands or quantum dots can be achieved easily.

SUMMARY OF THE INVENTION

The present invention provides a semiconductor light emitting device fabricated in the (Al,Ga,In)N material system having an AlGaN layer located on a substrate side of an active region containing InGaN quantum dots or quantum wires; wherein the distance between the active region and the $Al_xGa_{1-x}N$ layer is no more than 25 nm.

By 'fabricated in the (Al,Ga,In)N materials system' is meant that at least one of the semiconductor layers is an (Al,Ga,In)N layer. By "substrate side" is meant that side of the active region closer to the substrate in the grown device structure.

It has been found that providing the AlGaN layer on the substrate side of an InGaN quantum dot or quantum wire active region provides a greater optical power output. This is believed to result from improved injection of carriers into the active region; that is, the $Al_xGa_{1-x}N$ layer serves, in use, to promote the injection of carriers into the active region. The improvement in optical power output decreases as the separation between the $Al_xGa_{1-x}N$ layer and the active region increases, so that the $Al_xGa_{1-x}N$ layer is preferably close to the active region. It has been found that the separation between the $Al_xGa_{1-x}N$ layer and the active region should be not more that 25 nm to obtain a significant increase in optical power output.

A difference between the lattice constant of the $Al_xGa_{1-x}N$ layer and the lattice constant of the active region may be not more than 3%. This minimises the stress/strain introduced into the device, and so prevents any adverse effect on the device performance and/or lifetime. As explained above, the $Al_xGa_{1-x}N$ layer is provided to increase the optical power output of the device by, it is believed, promoting injection of carriers into the active region—the $Al_xGa_{1-x}N$ layer is not provided for strain compensation purposes.

The AlGaN layer may have a thickness greater than 5 nm, and it may have a thickness less than 50 nm. It has been found that this thickness range for the AlGaN layer provides significant improvement in the optical power output of the device.

The active region may comprise multiple InGaN quantum dot layers or quantum wire layers separated by capping (barrier) layers such as, for example, GaN barrier layers. Alternatively, the active region may comprise multiple $In_xGa_{1-x}N$ quantum dot layers or quantum wire layers separated by $In_yGa_{1-y}N$ barriers where x>y. Alternatively, the active region may contain only one quantum dot layer or only one quantum wire layer.

The InGaN quantum dot layer or quantum wire layer, or the first grown InGaN quantum dot layer or quantum wire layer if the active region contains two or more quantum dot layers or quantum wire layers, may be directly on top of the AlGaN layer. Alternatively, there may be a (In)GaN layer between the AlGaN layer and the (first) InGaN quantum dot layer or quantum wire layer. Since the formation of quantum dots or quantum wires is dependant on the lattice parameter and the surface energy of the underlying layer, it may be advantageous to grow the first layer of quantum dots or quantum wires on a layer of the same composition as the barrier layer separating the multiple quantum dot layers or quantum wire layers. Therefore all quantum dot layers or quantum wire layers would be grown on identical underlying layers. This may maximise the uniformity of the quantum dot layers or quantum wire layers.

The quantum dots or quantum wires may all be nominally the same size and composition resulting in a very narrow emission wavelength range. This is important in the laser diodes in order to reduce the threshold current.

The InGaN quantum dots or quantum wires within a single layer may consist of varying size and/or composition, where the size of the quantum dots is greater than 1 nm and less than 50 nm in all dimensions (or in two dimensions in the case of quantum wires) and the composition of the $In_xGa_{1-x}N$ is such that $0.01<x<0.99$. Alternatively all the quantum dots or quantum wires within a single layer may be the same size and composition, but the size and composition may vary between different quantum dot layers or quantum wire layers in the same device. This allows multiple wavelength emission from a single device, which has applications for full colour displays or general illumination. The emission spectrum may consist of separate emission bands or may be broad-spectrum emission.

Use of a quantum dot active region also improves the temperature stability of the output from a light-emitting device.

FIG. 3b shows the improvement in temperature stability of the wavelength of a light emitting diode when a quantum dot active region is used (open circles) instead of a quantum well active region (filled circles).

BRIEF DESCRIPTION OF THE DRAWINGS

Preferred embodiments of the present invention will now be described with reference to the attached drawings, in which.

DESCRIPTION OF EMBODIMENTS OF THE INVENTION

In the following, preferred embodiments of the invention are described in more detail.

A light-emitting device of the present invention may be manufactured using any suitable growth technique such as molecular beam epitaxy (MBE) or metal-organic vapour phase epitaxy (MOVPE). The invention is not limited to any specific growth technique. Any source of active nitrogen may be used in fabricating the present invention; this includes, but is not limited to $NH_3$ and a nitrogen plasma.

Figure 1:
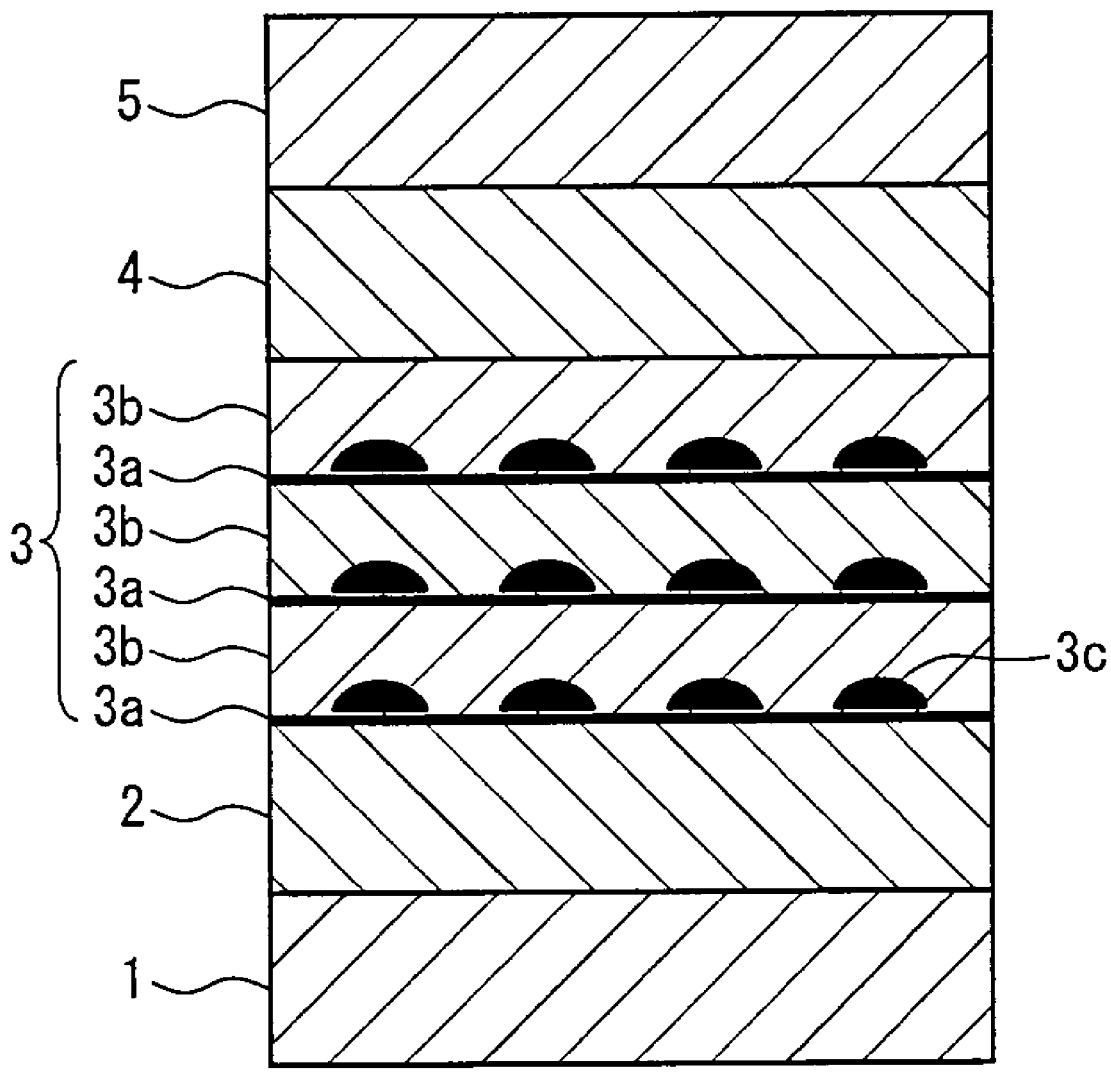
FIG. 1 is a schematic sectional view of a typical quantum dot light emitting diode in the AlGaInN material system.
Figure 2:
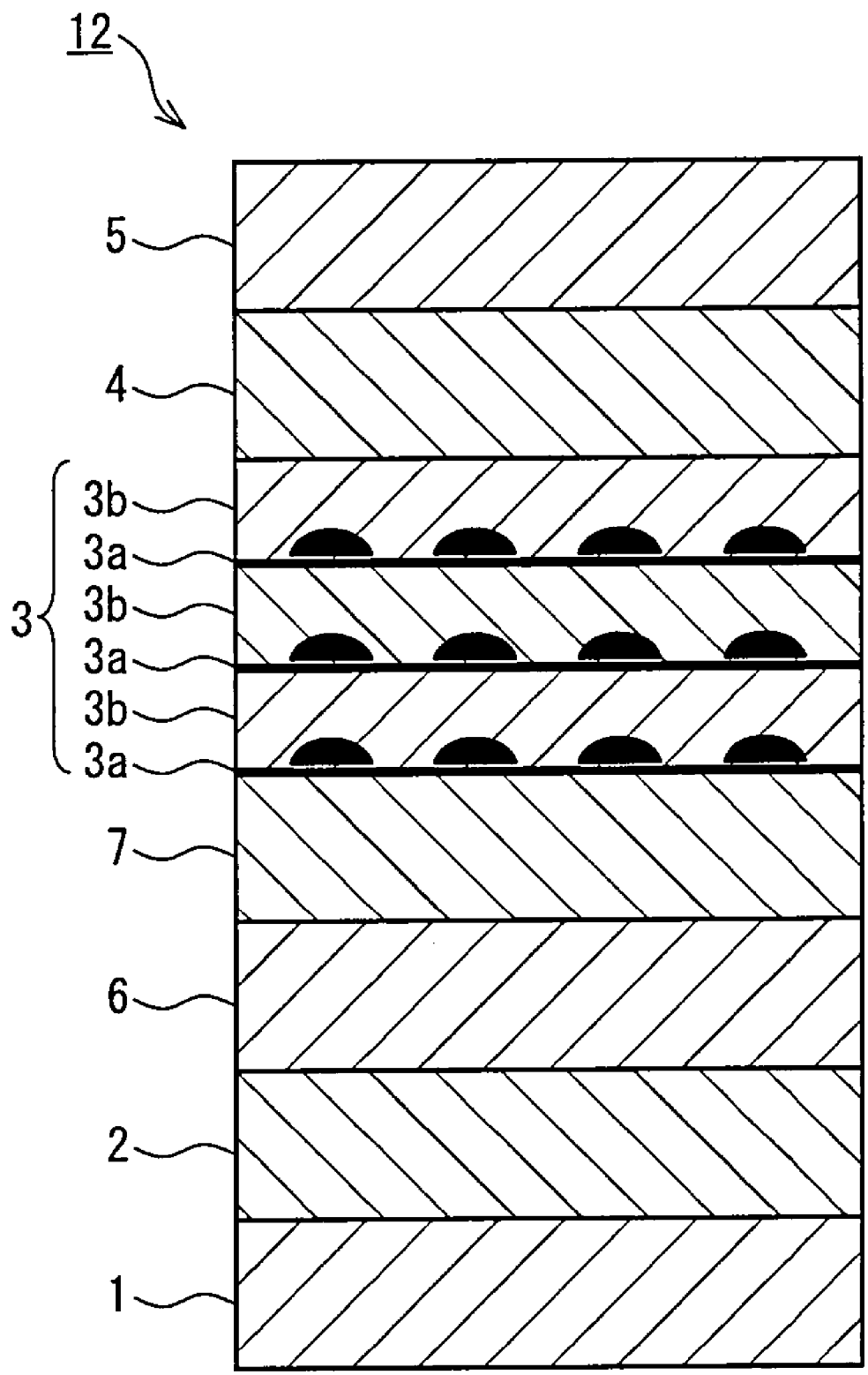
FIG. 2 is a schematic sectional view of a light emitting diode according to an embodiment of the present invention.
Figure 3A:
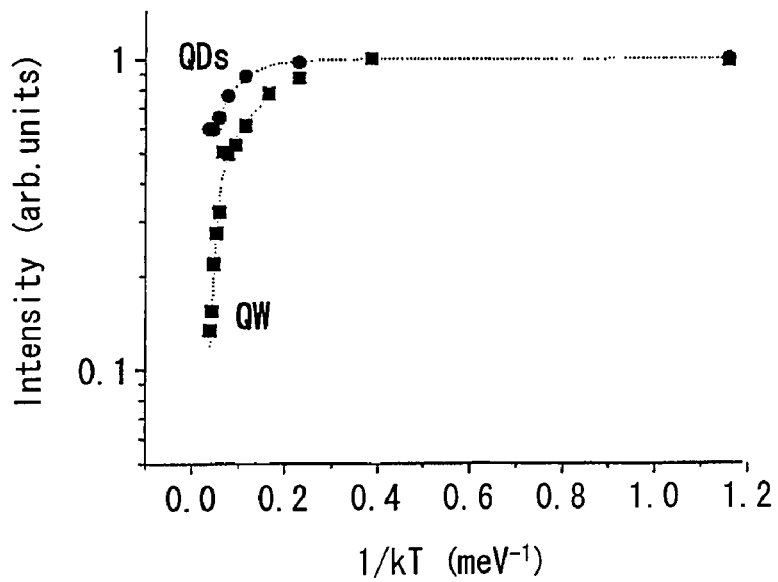
FIG. 3a is a comparison of temperature stability of photoluminescence intensity for a quantum well active region and a quantum dot active region.
Figure 3B:
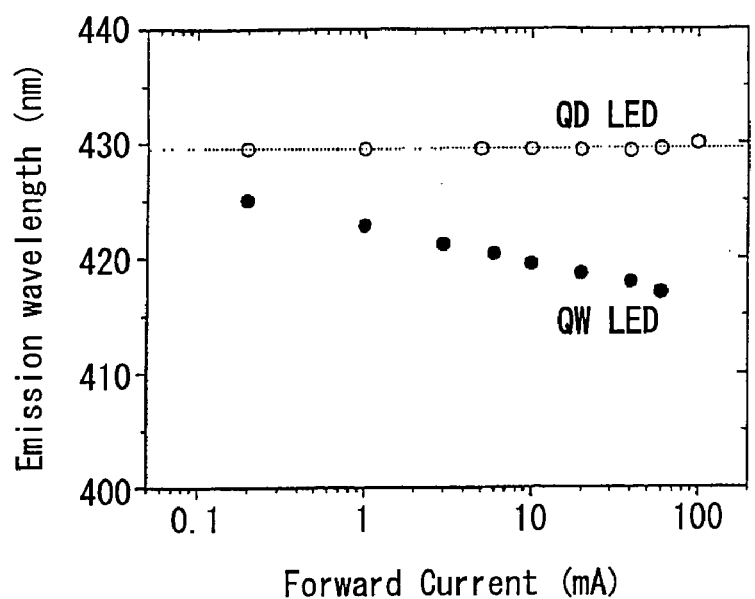
FIG. 3b illustrates the improved stability of temperature with wavelength for a quantum dot light emitting diode compared with a quantum well light emitting diode.

FIG. 2 is a schematic sectional view of a light-emitting device according to an embodiment of the invention. In this embodiment the light-emitting device is a light-emitting diode 12. The light-emitting device is fabricated in the (Al, Ga,In)N materials system.

The light emitting diode 12 of FIG. 2 comprises a substrate 1. The substrate may consist of any material with a suitable lattice parameter for growth of (Al,Ga,In)N. The substrate may comprise, but is not limited to, GaN, sapphire or silicon. In the light emitting diode 12 of FIG. 2 the substrate consists of sapphire.

The light emitting diode 12 of FIG. 2 may contain a buffer layer 2 disposed on the substrate layer 1. The buffer layer 2 may be of any orientation of GaN. In the light emitting diode 12 of FIG. 2 the buffer layer 2 is a 0.25 μm thick n-type GaN layer grown over a (0001) face of the sapphire substrate. The buffer layer may be grown by molecular beam epitaxy using $NH_3$ as a source of active nitrogen at a temperature of 900° C.

The light emitting diode 12 of FIG. 2 further contains an $Al_xGa_{1-x}N$ layer 6 with $0<x<1$ (ie, an AlGaN layer) disposed over the buffer layer 2. The $Al_xGa_{1-x}N$ layer 6 preferably has a composition wherein $0.05<x<0.2$. The $Al_xGa_{1-x}N$ layer 6 preferably has a thickness of between 5 nm and 50 nm. The AlGaN layer 6 may be not intentionally doped, or alternatively the AlGaN layer 6 may be n-type doped, using for example silicon. The AlGaN layer 6 may be grown by molecular beam epitaxy using $NH_3$ as a source of active nitrogen at a temperature of at least 500° C., and preferably in the range 600-650° C. The AlGaN layer 6 may be annealed to a temperature of at least 800° C. and preferably between 850° C. and 950° C.

As used herein the term (In)GaN refers to a layer of $In_xGa_{1-x}N$ with a composition of $0 \leq x<1$, and hence includes GaN as well as InGaN. The term InGaN refers to a layer of $In_xGa_{1-x}N$ with a composition of $0<x<1$.

The light emitting diode 12 of FIG. 2 may further contain an (In)GaN layer 7 disposed on the AlGaN layer 6. The (In)GaN layer 7 may have the same composition as the capping layer(s) 3b of the active region 3 (to be described below), or the (In)GaN layer 7 may have a different composition to the barrier layers 3b. The (In)GaN layer 7 may be not intentionally doped or it may be n-type doped with, for example, silicon.

In a device in which the active region comprises two or more quantum dot layers 3a (as in the embodiment shown in FIG. 2), the second quantum dot layer (and any subsequent quantum dot layer) will be disposed over a capping layer 3b which, as is described below, comprises InGaN or GaN. Providing the (In)GaN layer 7 has the effect that the first quantum dot layer 3a is also disposed over an InGaN or GaN layer. This should reduce the likelihood of there being significant unwanted differences between the properties of the first quantum dot layer and the properties of the second and subsequent quantum dot layers.

Preferably the composition of the (In)GaN layer 7 is the same as, or close to, the compositions of the capping layer(s) 3b, as this should again reduce the likelihood of there being significant unwanted differences between the properties of the first quantum dot layer and the properties of the second and subsequent quantum dot layers.

In the embodiment of FIG. 2 the spacing between the active region 3 and the AlGaN layer 6 is equal to the thickness of the (In)GaN layer 7. The thickness of the (In)GaN layer 7 is therefore preferably not more than 25 nm so that the spacing between the active region 3 and the AlGaN layer 6 is not more than 25 nm.

In more detail, the (In)GaN layer 7 may have a thickness in the range greater than 1 nm, and may have a thickness of less than 25 nm. It preferably has a thickness of greater than 2 nm, and preferably has a thickness of less than 5 nm or less than 10 nm. The thickness of the (In)GaN layer 7 is preferably not so great that the benefit on the quantum dot layer(s) of providing the AlGaN layer 6 is reduced significantly but, in an embodiment in which the active region has two or more active layers, is preferably sufficiently large to ensure that there is no significant difference between the properties of the first quantum dot layer and the properties of the second and subsequent quantum dot layers. It has been found that a thickness of the (In)GaN layer 7 in the range of 1-25 nm, and preferably in the range of 2-5 nm or 2-10 nm, ensures that that there is no significant undesired difference between the properties of the first quantum dot layer and the properties of the second and subsequent quantum dot layers without significantly reducing the benefit of providing the AlGaN layer 6.

The (In)GaN layer 7 may be omitted if the active region 3 has only a single active layer (eg a single quantum dot layer 3a). In this case the issue of minimising the difference between the properties of the first active layer (quantum dot layer) and the properties of the second and subsequent active layers (quantum dot layers) does not arise, and the AlGaN layer 6 may be provided directly adjacent to the active region.

The light emitting diode 12 of FIG. 2 has an active region 3 for light-emission containing one or more active layers containing InGaN quantum dots 3a disposed on the AlGaN layer 6, or on the (In)GaN layer 7 if present. The AlGaN layer 6 is thus disposed on the same side of the active region as the substrate, between the active region and the substrate. The $In_xGa_{1-x}N$ quantum dot layer(s) 3a may have a composition wherein $0.01<x<0.99$. The $In_xGa_{1-x}N$ quantum dot layer(s) 3a may preferably have a composition wherein $0.15<x<0.25$. The quantum dots may have a size wherein all three dimensions are less than 50 nm. The quantum dots may have a size wherein the height is less than 10 nm. The quantum dots may have a size wherein the height is between 1 nm and 3 nm. The quantum dots may be not intentionally doped, or alternatively the quantum dots may be doped either n-type or p-type. The quantum dots may be formed by any suitable technique.

In order to minimise stress/strain in the device structure, the magnitude of the difference between the lattice constant of the $Al_xGa_{1-x}N$ layer 6 and the lattice constant of the active region is preferably kept as low as possible, for example is not more than 3% or even not more that 2% (by referring to a "magnitude" of 3% is meant that the difference is preferably between 3% and −3%, etc).

The active region 3 of the light emitting diode 12 of FIG. 2 may contain one or more $In_yGa_{1-y}N$ capping layer(s) 3b, each disposed over a respective $In_xGa_{1-x}N$ quantum dot active layer 3a. The $In_yGa_{1-y}N$ capping layer(s) may have a composition wherein $0 \leq y<x$. The capping layer(s) 3b may have a thickness of greater than 1 nm, and may have a thickness of less than 50 nm. The capping layers 3b may have a thickness of greater than 5 nm, and may have a thickness of less than 15 nm. The capping layers 3b may be not intentionally doped, or alternatively may be doped n-type or p-type.

The InGaN quantum dot active layer 3a and the (In)GaN capping layer 3b may be repeated in the sequence 3a, 3b, 3a, 3b, 3a, 3b etc to form an active region 3 with multiple layers of quantum dots. This sequence may be continued to form more than three layers of quantum dots 3a. Alternatively, the active region may include only a single layer of quantum dots 3a.

The final (In)GaN capping layer 3b may be omitted, such that the final quantum dot layer 3a is in direct contact with the AlGaN layer 4 or GaN layer 5 grown over the active region (these are described below).

It is known to use upper and lower AlGaN layers to surround the active region in an InGaN quantum well light emitting device—see for example, US2005/0116215A1. This document relates specifically to the use of quantum wells in the active region and discloses the use of lower and upper AlGaN layers in the active region to provide better carrier confinement in the quantum wells. The improvement in carrier confinement described in this document is specific to the use of quantum wells. JP 11-126949 also discloses a device structure in which upper and lower AlGaN layers acts as cladding layers disposed on either side of the active region in an InGaN quantum well light emitting device, with a GaN guiding layer disposed between the each cladding layer and the active region. However, the separation between the lower AlGaN layer and the active region is considerably greater in JP 11-126949 than in the present invention so that the improved optical output power obtained in the invention does not occur in JP 11-126949.

The present invention, in contrast, relates to the combination of the use of quantum dots in the active region with a lower AlGaN layer, which improves the electroluminescence. The lower AlGaN layer is believed to provide better injection of carriers into the active region 3, and thus increased output power. Carrier confinement in a quantum dot active layer 3a as used in the present invention is already good, since quantum dots provide good confinement, and the lower AlGaN layer is not believed to have any significant effect on the carrier confinement in the quantum dot active layer(s) 3a.

The preferred composition range $0.05<x<0.2$ for the lower $Al_xGa_{1-x}N$ layer, and the preferred growth conditions given above, have been found to give the greatest optical output power.

S E Hooper et al describe, in US 2006/0244002, growing an aluminum-containing nitride semiconductor layer over an InGaN layer to form an electron gas region and thereby improve the output power from a quantum well light emitting diode. There is no indication that this method of creating an electron gas would be of any benefit in a device containing a quantum dot active region.

Luo et al report in 3.Elec.Mat. 30 (5) 2001, p 459 an improvement in photoluminescence emission intensity from InAs quantum dots coupled to a 2DEG. There is no indication from this publication that the combination of an AlGaN layer below an InGaN quantum dot active region in the AlGaInN system would result in an increase of electroluminescence.

Moreover, while devices of the invention may appear superficially similar to the structure of JP-10 215 029 (above), the underlying technical effect is quite different. The present invention achieves improved injection of carriers into the active region, whereas JP-10 215 029 provides a thin film in order to promote "three-dimensional island-shape growth".

Figure 4:
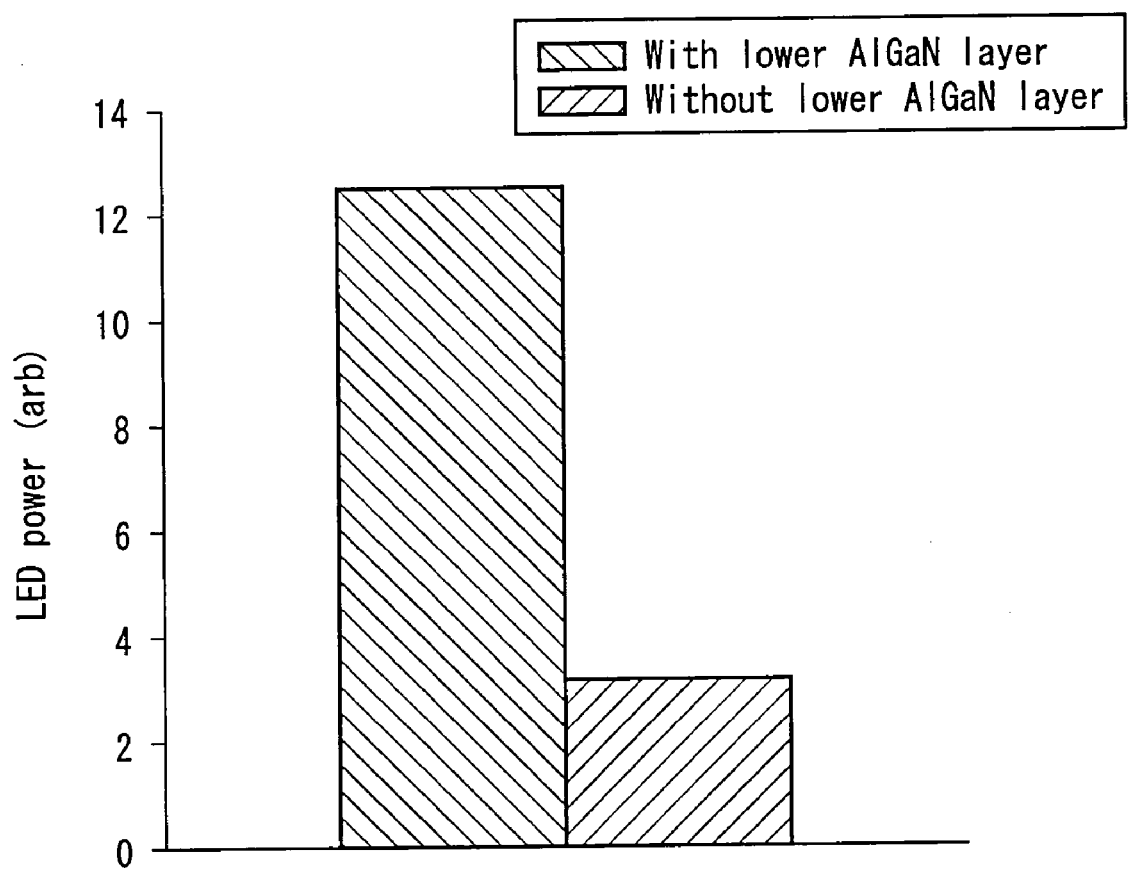
FIG. 4 is an illustration of the increase in electroluminescence owing to the inclusion of a AlGaN layer below a quantum dot active region.

FIG. 4 shows the improvement in electroluminescence that is achieved when a lower AlGaN layer is provided below a quantum dot active region. As can be seen, providing the AlGaN layer increases the output power by a factor of approximately 4. The two structures used to obtain the results of FIG. 4 were identical apart from the provision of the AlGaN layer 6 in one structure but not in the other. In the structure that contained the AlGaN layer 6, the spacing between the AlGaN layer and the active region was 2 nm, and the thickness of the AlGaN layer was 20 nm. This combination of a quantum dot active region and a lower AlGaN layer, which improves the injection of electrons into the quantum dot active region, allows the advantages of a quantum dot active region to be exploited while still achieving a good output power.

As noted above, the spacing between the AlGaN layer and the active region should preferably not exceed 25 nm. When the comparison of FIG. 4 was repeated with a structure having an AlGaN layer 6 spaced more than 25 nm from the active region, it was found that there was little or no improvement in the output power of the device.

The InGaN quantum dot layer 3a and (In)GaN capping layer 3b may be grown by molecular beam epitaxy using a nitrogen plasma as an active nitrogen source at a temperature in the range 400° C. to 900° C. and preferably in the range 550° C. to 700° C.

The light emitting diode 12 of FIG. 2 may contain a GaN layer 5 disposed over the active region on the final quantum dot layer 3a or on the final capping layer 3b if present. The GaN layer 5 may be doped p-type with, for example, magnesium. The GaN layer 5 may have a thickness of greater than 1 nm and less than 1 µm, and preferably a thickness of greater than 100 nm and less than 200 nm. A GaN layer 5 may be grown by molecular beam epitaxy using $NH_3$ as an active nitrogen source at a temperature in the range 600° to 1100° C. and preferably in the temperature range 700° C. to 1000° C.

An upper AlGaN layer 4 may be disposed on the uppermost layer of the active region—that is, on the final InGaN quantum dot layer 3a or the final (In)GaN capping layer 3b, whichever is the finally-grown layer of the active region—to act as an electron blocking layer. The $Al_zGa_{1-z}N$ layer 4 may have a composition wherein 0<z<0.5, and preferably may have a composition wherein 0.1<z<0.25. The AlGaN layer 4 may be grown by molecular beam epitaxy using $NH_3$ as an active nitrogen source at a temperature in the range 600° C. to 1100° C. Alternatively the upper AlGaN layer 4 may be omitted.

Figure 5:
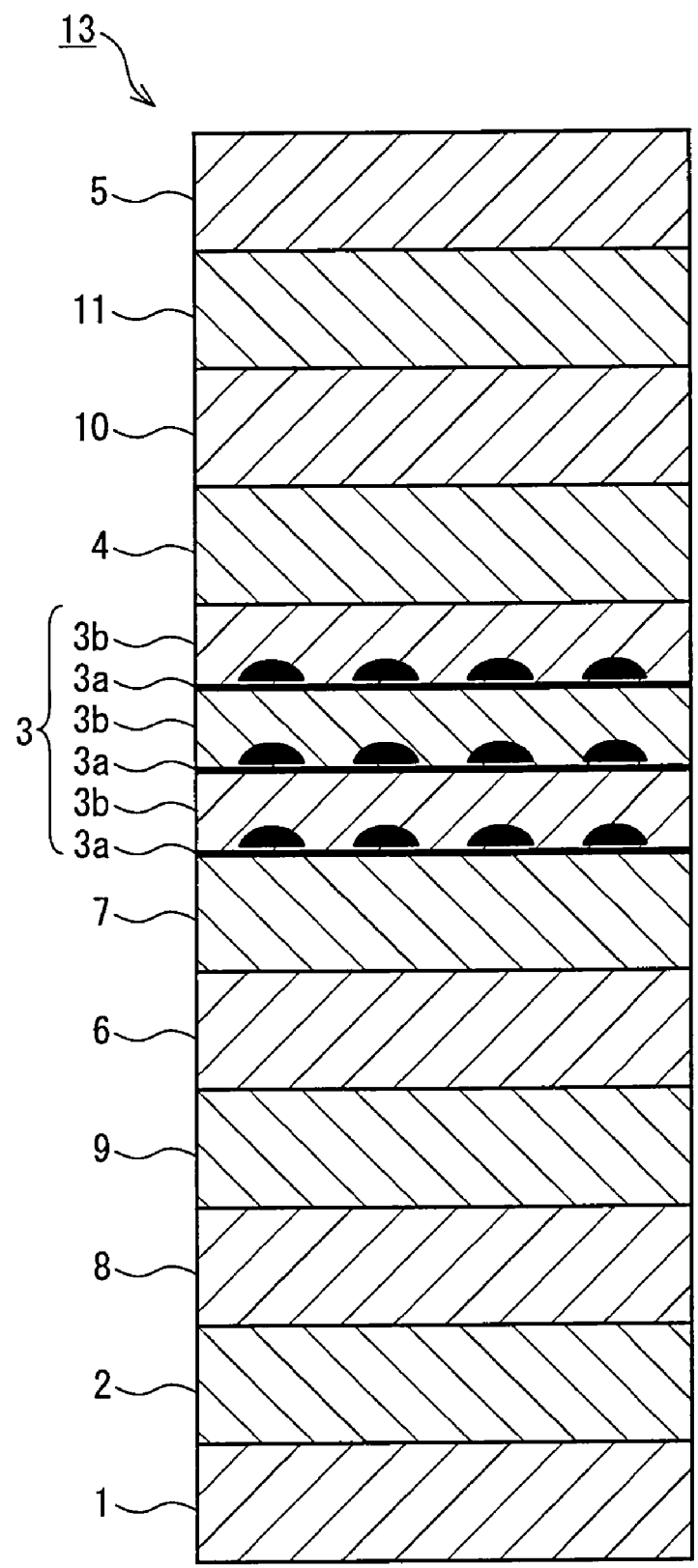
FIG. 5 is a schematic sectional view of a laser diode according to an embodiment of the present invention.

The present invention may also be applied to a laser diode. FIG. 5 is a schematic sectional view of a laser diode 13 according to an embodiment of the invention. Layers 1, 2, 6, 7, 3, 3a, 3b, 4, and 5 of the laser device 13 of FIG. 5 are as already described for the light emitting diode 12 of FIG. 2. In addition the laser diode structure 13 of FIG. 5 may contain a first AlGaN cladding layer 8 disposed on the buffer layer 2, a first GaN optical guiding layer 9 disposed on the first AlGaN cladding layer 8, a second GaN optical guiding layer 10 disposed over the active region 3 (on the final quantum dot layer 3a, on the final quantum dot capping layer 3b if present, or on the upper AlGaN layer 4 if present) and a second AlGaN cladding layer 11 disposed on the second GaN optical guiding layer 10.

In the laser diode 13 of FIG. 5, the first AlGaN cladding layer 8 and first GaN optical guiding layer 9 may be doped n-type with, for example, silicon. The second GaN optical guiding layer 10 and second AlGaN cladding layer 11 may be doped p-type with, for example, magnesium.

In the laser diode 13 of FIG. 5, the first cladding layer 8 may be an $Al_z'Ga_{1-z'}N$ layer with a composition wherein 0.01<z'<0.5. The first cladding layer 8 may have a thickness greater than 100 nm and less than 2 µm and preferably has a thickness of approximately 0.5 µm. The second cladding layer 11, may also be an $Al_z'Ga_{1-z'}N$ layer with a composition wherein 0.01<z'<0.5. The second AlGaN cladding layer 11 may have a thickness greater than 100 nm and less than 2 µm and preferably has a thickness of approximately 0.5 µm.

In the laser diode 13 of FIG. 5, the first GaN optical guiding layer 9 may have a thickness greater than 10 nm and less than 1 µm, and preferably has a thickness of approximately 100 nm. The second GaN optical guiding layer 10 may have a thickness greater than 10 nm and less than 1 µm, and preferably has thickness of approximately 300 nm.

Layers 8, 9, 10 and 11 of the laser diode 13 in FIG. 5 may all be grown by molecular beam epitaxy using $NH_3$ as the active nitrogen source at a temperature greater than 600° C. and less than 1100° C. and preferably in the range greater than 850° C. and less than 1000° C. The growth temperatures may be different for the different layers.

The invention has been described with reference to embodiments having a quantum dot active region. However, the use of a quantum wire active region will also provide an increase in the confinement of carriers compared with a conventional quantum well region and therefore provide some of the benefits associated with the use of a quantum dot active region. The invention is therefore not limited to a device having an active region including quantum dot active layers but may also be applied to devices having an active region including quantum wire active layers. One skilled in the art may therefore apply the invention to a semiconductor light-emitting device having a quantum wire active region, by providing an AlGaN layer below the quantum wire active region, to obtain an increase in output power from the light-emitting device.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor light-emitting device fabricated in the (Al,Ga,In)N materials system, and having an $Al_xGa_{1-x}N$ layer located on a substrate side of an active region for light emission, the active region comprising InGaN quantum dots or InGaN quantum wires; wherein the distance between the active region and the $Al_xGa_{1-x}N$ layer is no more than 25 nm.

2. A device as claimed in claim 1 wherein a magnitude of a difference between the lattice constant of the $Al_xGa_{1-x}N$ layer and the lattice constant of the active region is not more than 3%.

3. A device as claimed in claim 1 wherein the $Al_xGa_{1-x}N$ layer has 0.05<x<0.2.

4. A device as claimed in claim 1 wherein the $Al_xGa_{1-x}N$ layer is doped n-type.

5. A device as claimed in claim 1 wherein the $Al_xGa_{1-x}N$ layer is not intentionally doped.

6. A device as claimed in claim 1 and further comprising an (In)GaN layer disposed between the active region and the $Al_xGa_{1-x}N$ layer.

7. A device as claimed in claim 6 wherein the (In)GaN layer is a GaN layer.

8. A device as claimed in claim 6 wherein the (In)GaN layer is an $In_yGa_{1-y}N$ layer where $0 \leq y < x$.

9. A device as claimed in claim 6 wherein the (In)GaN layer has thickness of at least 1 nm.

10. A device as claimed in claim 6 wherein the (In)GaN layer has a thickness of at least 2 nm.

11. A device as claimed in claim 6 wherein the (In)GaN layer has a thickness of no more than 25 nm.

12. A device as claimed in claim 6 wherein the (In)GaN layer has thickness of no more than 10 nm.

13. A device as claimed in claim 1 wherein the active region comprises two or more active layers, each active layer containing InGaN quantum dots or InGaN quantum wires, and wherein a respective capping layer is provided between each pair of neighbouring active layers.

14. A device as claimed in claim 13 and comprising a further capping layer provided over the non-substrate side of the active region.

15. A device as claimed in claim 1 wherein the active region comprises a single active layer, the active layer containing InGaN quantum dots or InGaN quantum wires.

16. A device as claimed in claim 15 and further comprising a capping layer provided over the non-substrate side of the active region.

17. A device as claimed in claim 13 wherein each capping layer is an (In)GaN layer.

18. A device as claimed in claim 17 wherein each capping layer is a GaN layer.

19. A device as claimed in claim 17 wherein each capping layer is an $In_yGa_{1-y}N$ layer where $0 \leq y < x$.

20. A device as claimed in claim 1 and further comprising a substrate.

21. A device as claimed in claim 20 wherein the substrate is selected from the group consisting of: a GaN substrate, a sapphire substrate, and a silicon substrate.

22. A device as claimed in claim 1 wherein the $Al_xGa_{1-x}N$ layer has a thickness greater than 5 nm.

23. A device as claimed in claim 1 wherein the $Al_xGa_{1-x}N$ layer has a thickness less than 50 nm.

24. A device as claimed in claim 1 and comprising a light-emitting diode.

25. A device as claimed in claim 1 and comprising a laser diode.

\* \* \* \* \*